(12) United States Patent
Boerner

(10) Patent No.: US 8,013,519 B2
(45) Date of Patent: Sep. 6, 2011

(54) ORGANIC ELECTROLUMINESCENT LIGHT SOURCE

(75) Inventor: Herbert Friedrich Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 542 days.

(21) Appl. No.: 11/720,859

(22) PCT Filed: Nov. 28, 2005

(86) PCT No.: PCT/IB2005/053931
§ 371 (c)(1),
(2), (4) Date: Jun. 5, 2007

(87) PCT Pub. No.: WO2006/061729
PCT Pub. Date: Jun. 15, 2006

(65) Prior Publication Data
US 2009/0224654 A1 Sep. 10, 2009

(30) Foreign Application Priority Data
Dec. 6, 2004 (EP) .................................... 04106336

(51) Int. Cl.
*H05B 33/04* (2006.01)
*H01J 9/24* (2006.01)
(52) U.S. Cl. .......................................... 313/504; 455/23
(58) Field of Classification Search ........... 313/498–512
See application file for complete search history.

(56) References Cited

U.S. PATENT DOCUMENTS

| | | | |
|---|---|---|---|
| 6,066,861 A | 5/2000 | Hoehn et al. | |
| 6,447,908 B2 * | 9/2002 | Yun et al. | 428/403 |
| 6,566,808 B1 * | 5/2003 | Duggal et al. | 313/512 |
| 6,717,176 B1 | 4/2004 | Chuang | |
| 2001/0052589 A1 * | 12/2001 | Hampden-Smith et al. | 252/301.4 S |
| 2003/0227249 A1 * | 12/2003 | Mueller et al. | 313/491 |
| 2004/0256974 A1 * | 12/2004 | Mueller-Mach et al. | 313/485 |
| 2005/0064239 A1 * | 3/2005 | Takei | 428/690 |

FOREIGN PATENT DOCUMENTS

| | | |
|---|---|---|
| JP | 11500584 A | 1/1999 |
| JP | 2002523610 A | 7/2002 |
| JP | 2003163076 A | 6/2003 |
| WO | 2004060021 | 7/2004 |

* cited by examiner

*Primary Examiner* — Toan Ton
*Assistant Examiner* — Zachary Snyder

(57) ABSTRACT

An electroluminescent light source includes a substrate and a layer structure applied to the substrate for emitting light at least on the side facing away from the substrate. The layer structure includes an electroluminescent layer between two electrodes. A partially transparent encapsulation device forms a closed volume around the layer structure, and is filled with a dielectric fluid which is substantially chemically inert with respect to the layer structure. The fluid contains particles for absorbing parts of the light emitted by the layer structure and for re-emitting light of a different wavelength. The density of the particles is selected such that the particles in the dielectric fluid are in the suspended state in the operational state of the light source.

20 Claims, 3 Drawing Sheets

ORGANIC ELECTROLUMINESCENT LIGHT SOURCE

The invention relates to an encapsulated organic electroluminescent light source for emitting white light by means of color conversion.

Electroluminescent light sources (EL light sources) consisting of a plurality of thin layers with an organic electroluminescent layer (EL layer) for emitting light are known. Since the organic layers in particular react sensitively to ambient conditions such as moisture for example, the EL light source is mechanically encapsulated and the intermediate space between layer structure and encapsulation is filled with chemically inert substances. A distinction is usually made between bottom emitters (emission through a transparent substrate) and top emitters (emission through a transparent encapsulation). In the case of top emitters, the substrate may also be non-transparent. Organic EL layers may emit in one or more spectral regions. White light can be produced in a simple manner by mixing the light emitted by the EL layer with light emitted by a fluorescent material. By way of example, blue light of the EL layer is partially absorbed by the fluorescent material and re-emitted with longer wavelengths, for example in the yellow spectral region or in the green and red spectral region (color conversion). The mixture of blue light and re-emitted light produces white light.

Document U.S. Pat. No. 6,717,176 describes an organic electroluminescent light source as a top emitter with a color-converting layer which is applied as a thin layer to the inner side of the encapsulation device. Such an additional layer gives rise to additional production complexity and thus to additional costs on account of the additional coating process. Moreover, the properties of the color-converting layer, for example layer adhesion, must remain constant over the entire service life.

It is an object of the present invention to provide a cost-effective electroluminescent light source as a top emitter for emitting white light by means of light conversion, while avoiding the disadvantages of the prior art.

This object is achieved by an electroluminescent light source comprising a substrate, a layer structure applied to the substrate for emitting light at least on the side facing away from the substrate, said layer structure comprising at least one electrode as anode, at least one electrode as cathode and at least one organic electroluminescent layer located therebetween, wherein the electrode is at least partially transparent on the side facing away from the substrate, and an at least partially transparent encapsulation device for forming a closed volume around the layer structure, which device is filled with a dielectric fluid which is substantially chemically inert with respect to the layer structure, said fluid containing particles for absorbing parts of the light emitted by the layer structure and for re-emitting light of a different wavelength, the density of said particles being selected such that the particles in the dielectric fluid are in the suspended state. By selecting particles having a density which corresponds to the density of the dielectric fluid, a uniform and temporally constant distribution of the particles in the dielectric fluid is achieved, and thus a constant absorption and re-emission behavior regardless of the spatial arrangement of the EL light source, for example horizontal, upright or suspended. Prior to producing the EL light source, the particles can simply be admixed with the dielectric fluid. There is no need for a complex coating process to produce a color-converting particle layer.

It is advantageous if the proportion by volume of the particles in the dielectric fluid is between 5 and 60%. In this way, a sufficient amount of light for the desired color mixing is absorbed by the particles and re-emitted.

It is furthermore advantageous if the particles have a diameter greater than 100 nm, preferably greater than 500 nm, since, with smaller diameters, the ratio between absorption of the light and back-scattering of the light becomes too unfavorable.

It is advantageous if the refractive index of the particles is greater than 1.4. Since suitable dielectric fluids have a refractive index of between 1.25 and 1.35, the entry of light into the particles thus corresponds to a transition from an optically thinner medium to an optically thicker material, without coupling losses due to total reflection.

Particles which consist of a first material for absorbing and re-emitting light and a second material for setting their density are particularly advantageous. It is therefore also possible to use first light-absorbing and re-emitting materials the densities of which differ greatly from the density of the dielectric fluid.

It is even more advantageous if the first material for absorbing and re-emitting light is a material which has a high density and the second material for setting the density is a material for absorbing and re-emitting light which has a low density. In this way, the volume of the second material can be used, in addition to setting the appropriate density, also for absorbing and re-emitting light. In this case, it is also possible for the emitted spectral regions of the first and second material to be different.

Particles comprising an inorganic material as the first material are highly suitable in particular for electroluminescent light sources with a high optical irradiance.

On the other hand, particles comprising an organic material as the first material are highly suitable in particular for electroluminescent light sources with a low optical irradiance.

It is furthermore advantageous if the first material of the particles is surrounded by the second material of the particles. It is thus possible to set the surface of the particles and thus the scattering behavior of the particles.

In order to produce white light, in particular with a high color rendering index, it is advantageous if the dielectric fluid contains at least first particles for emitting light in a first spectral region and second particles for emitting light in a second spectral region.

The invention also relates to a method of producing a dielectric fluid which contains particles for absorbing light and for re-emitting light of a different wavelength, the density of which particles is selected such that the particles in the dielectric fluid are in the suspended state, for use in organic electroluminescent light sources according to the invention, said method comprising the following steps:

producing a solution or melt of the second material (1202) of the particles (12), preferably plastic, adding pulverulent first material (1201) for absorbing and re-emitting light to the solution or melt of the second material (1202) of the particles (12), in a concentration suitable for producing a specific density of the particles (12), blowing the solution or melt through a nozzle to form particles (12) of joined first (1201) and second (1202) material, collecting and possibly cooling the particles (12), adding the particles (12) thus formed to the dielectric fluid (11), removing the particles (12) with densities that are too low/high following rising and/or sedimentation thereof in the dielectric fluid, producing a homogeneous distribution of the particles (12) in the dielectric fluid (11) by rotating or stirring in a suitable container.

The invention will be further described with reference to examples of embodiments shown in the drawings to which, however, the invention is not restricted.

Figure 1:
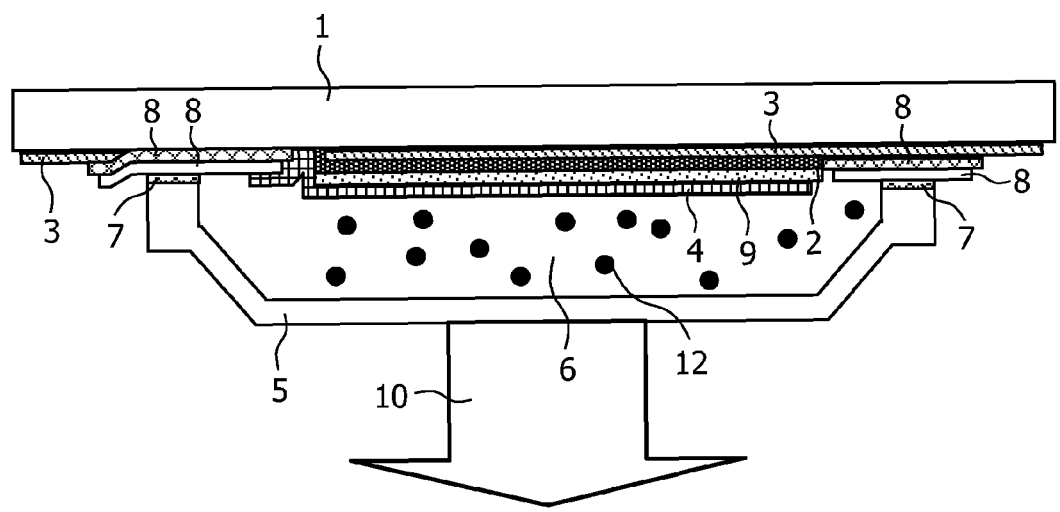
FIG. 1 shows a top-emitting electroluminescent light source according to the invention.

FIG. 1 shows the side view of an electroluminescent light source as a so-called top emitter, that is to say light 10 is emitted through an at least partially transparent encapsulation device 5. Because of this emission direction, the substrate 1 may also be non-transparent. The layer structure of the electroluminescent light source, which is applied to the substrate 1, contains a thin organic layer packet comprising an electroluminescent layer 2 (for example doped tris-(8-hydroxyquinolato)aluminum) with a typical thickness of around 100 nm, which is arranged between two electrodes 3 and 4 (for example an anode 3 and a cathode 4 as shown in FIG. 1). In the case of top emitters, the electrode lying in the emission direction, in this case the cathode 4, is at least partially transparent. Usually, indium tin oxide (ITO) is used as the transparent conductive material. A metal layer, for example aluminum, having a thickness of around 100 nm is used as the conductive material for the anode 3, which is usually non-transparent. However, arrangements are also possible in which the light is emitted simultaneously in the top and bottom directions. In such an arrangement, anode 3 and substrate 1 both consist of an at least partially transparent material. Between the organic luminescent layer 2 and the anode 3, there is usually another organic layer as a hole transport layer, typically alpha-NPD (N,N'-di(naphthalen-2-yl)-N,N'-diphenylbenzidine) with a thickness of around 50 nm. Between cathode 4 and organic luminescent layer 2 there is usually a thin electron injection layer 9 consisting of a material with a low work function, for example lithium, cesium or barium, which is important for good injection of the electrons into the luminescent layer. The layer structure may in principle also be applied to the substrate in the reverse sequence. In other embodiments of an electroluminescent light source, other layers may also be added to the layer structure, for example microcavity layers for improving the exit of light. Since the layer structure reacts very sensitively to ambient conditions, in particular moisture, electroluminescent arrangements are provided with an encapsulation device. The encapsulation device 5, which in the case of top emitters is at least partially transparent, is connected to the layer structure by means of adhesive joins 7, so that a closed volume 6 is produced between layer structure and encapsulation device 5. In order to protect the layer structure, the volume 6 is filled with a dielectric fluid 11 which is substantially chemically inert with respect to the layer structure, said dielectric fluid containing particles 12 according to the invention in a suspended state for partially absorbing the light emitted by the EL layer and then re-emitting light with a different wavelength. Suitable dielectric fluids include fluorinated dielectric fluids, such as for example FC-43 from [3]M having a density of 1.88 g/cm$^3$ and a refractive index of 1.29 or Solvay Fomblin having a density of 1.89 g/cm$^3$ to 1.92 g/cm$^3$ and a refractive index of 1.30. Particles which have a density that differs by less than 5% from the density of the dielectric fluid used are in a suspended state in the fluid and thus allow a spatially and temporally independent absorption behavior of the dielectric fluid comprising particles. Customary distances between encapsulation device 5 and layer structure lie in the range from a few tens of μm to a few hundred μm. The encapsulation device 5 shown here is just one possible embodiment. In other embodiments, the encapsulation device may also be designed differently. For example, a getter material may also be arranged within the volume 6 in order to reduce the amount of moisture/water. Conductor tracks 8 and 3 are led out of the volume 6 for the electrical actuation of the layer structure located within the encapsulation.

Figure 2:
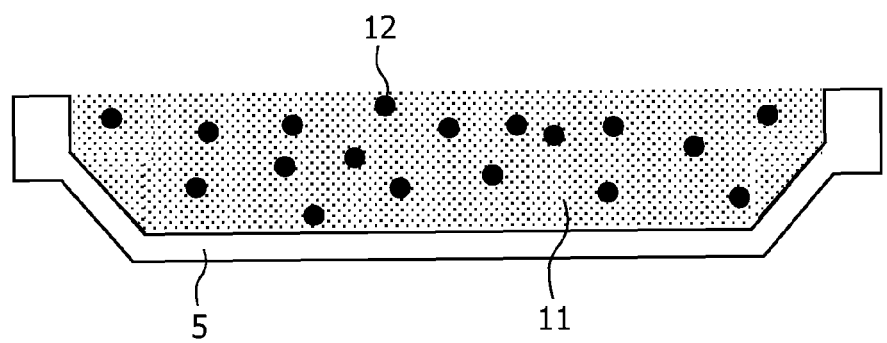
FIG. 2 shows an encapsulation device filled with dielectric fluid containing particles according to the invention.

FIG. 2 shows an encapsulation device 5 which is filled with the dielectric fluid 11 according to the invention. Before the encapsulation device is fixed on the layer arrangement, the encapsulation device 5 is in a horizontal state, wherein the subsequent inner side of the encapsulation device (the side of the encapsulation device which together with the layer structure delimits the subsequent volume 6) points upward in order to be filled with the dielectric fluid 11. In this position, it is possible with little complexity to fill the dielectric fluid 11 with the particles 12 contained therein into the encapsulation device 5. The particles 12 are added to the dielectric fluid 11 before the encapsulation device is filled, and are distributed homogeneously in the dielectric fluid by means of a suitable mixing operation, for example stirring and/or rotating the fluid in a container. Depending on the absorption capability of the particle material and the desired color conversion, the proportion by volume of the particles 12 in the dielectric fluid is between 5% and 60%. For the same desired transmission of the light emitted by the EL layer through the volume 6 filled with dielectric fluid 11, for example, the proportions by volume for particles with a high absorption capability can be selected to be lower than the proportions by volume for particles with a correspondingly lower absorption capability. It is advantageous if the diameter of the particles 12 is greater than 100 nm, even more advantageously greater than 500 nm, since otherwise the ratio between absorption and back-scattering becomes too unfavorable. The filling of the encapsulation device 5 with the dielectric fluid may be carried out for example by pouring or spraying. For a light conversion which is independent of the subsequent spatial arrangement of the electroluminescent light source, it is necessary for the volume 6 to be almost completely filled with the dielectric fluid. Once the encapsulation device 5 has been filled, the layer structure with the substrate will be glued onto the encapsulation device, which is still in a horizontal position, in order to produce the electroluminescent light source shown in FIG. 1.

In another embodiment, the encapsulation device may also be provided with a closable opening. In such an embodiment, the encapsulation device is glued onto the layer structure in the unfilled state and then the dielectric fluid containing particles is filled through the opening. Once the volume 6 is completely filled, the opening is closed by suitable means, for example silicon or a seal glued over the opening.

It is advantageous if the filling of the encapsulation device or electroluminescent light source takes place in a dry atmosphere or in vacuo.

Figure 3:
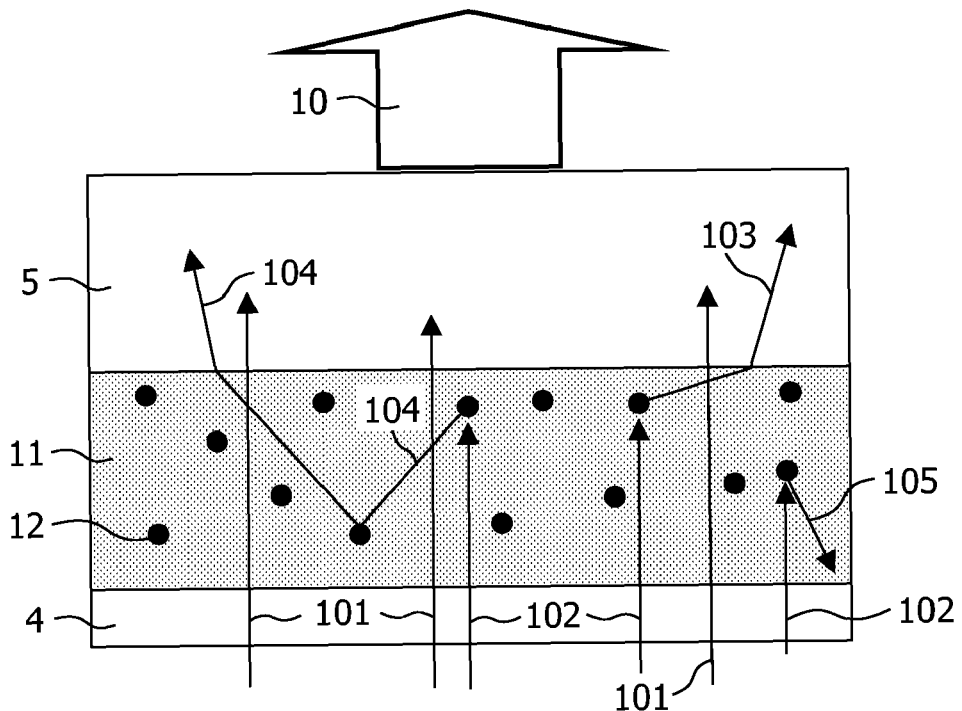
FIG. 3 shows the schematic ray path of the light in an electroluminescent light source.

In one embodiment, white light can be produced by means of color conversion by partial absorption of light in the blue spectral region which is emitted by the organic EL layer and re-emission of light in the yellow spectral region and subsequent mixing of the yellow and blue light. The white light is obtained within the volume 6 by virtue of color mixing of the non-absorbed blue light, which is emitted over the surface of the EL layer and thus illuminates wide areas of the volume 6, and of the isotropically re-emitted yellow light, as shown schematically on the basis of the various possible ray paths in FIG. 3. Part of the light passes through the dielectric fluid 11 without being absorbed by the particles 12 (arrows 101). The other part of the light (arrows 102) strikes particles 12 and is either scattered or absorbed. It is advantageous here if the refractive index of the particles is greater than the refractive index of the dielectric layer, so that the light is coupled into the particles for the desired subsequent absorption without coupling losses due to total reflection on the particle surface. Following isotropic re-emission by the particles, the light exhibits three types of propagation which are in principle different. Part of the re-emitted light is coupled out and into the material of the encapsulation device 5 without striking other particles 12 (arrow 103). Part of the re-emitted light is scattered at other particles 12 in the direction of the encapsulation device (multiple scattering is also possible) and coupled out of the dielectric fluid (arrow 104). Another part of the re-emitted light is passed back in the direction of the cathode 4 (arrow 105).

Figure 4:
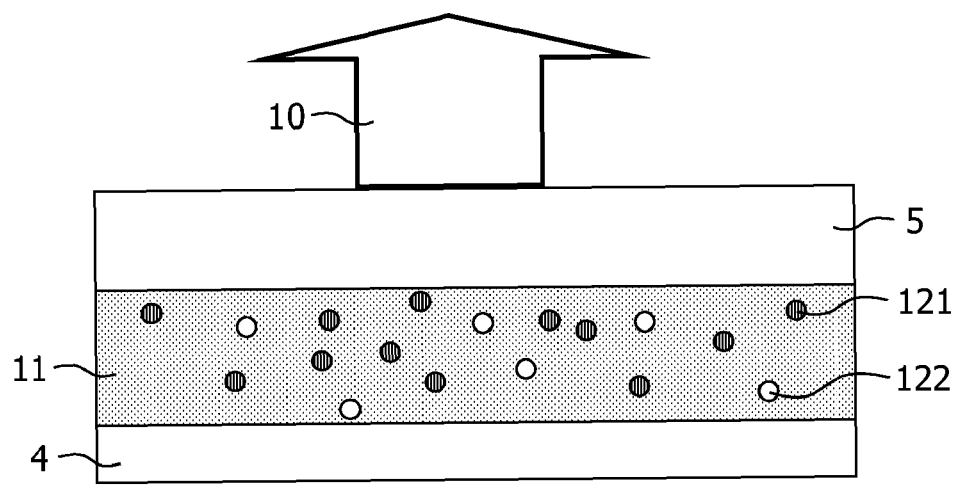
FIG. 4 shows an electroluminescent light source according to the invention comprising first and second particles in the dielectric fluid.

FIG. 4 shows one particularly advantageous embodiment of the electroluminescent light source comprising a dielectric fluid 11 which contains first particles 121 for re-emitting light in a first spectral region and second particles 122 for re-emitting light in a second spectral region. For example, with an EL layer which emits in the blue spectral region and first 121 and second 122 particles which re-emit in the green and red spectral region, white light can be produced with a higher color rendering index than in the previous example of embodiment comprising particles which re-emit only in the yellow spectral region. The use of more than two types of particles which emit in the green, orange and red spectral region is even more advantageous in respect of the color rendering index. Organic EL layers with light emission in different spectral regions are also advantageous in respect of a high color rendering index.

Figure 5:
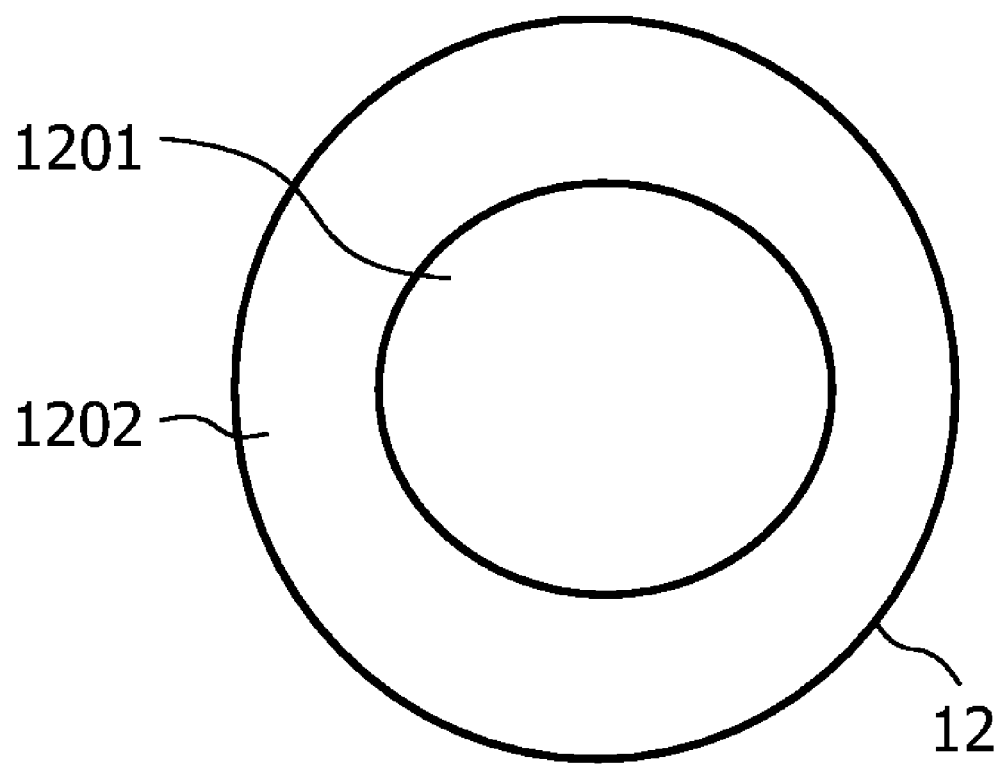
FIG. 5 shows the structure of the particles according to the invention which consist of more than one material.

In one particularly advantageous embodiment, materials 1201 for light absorption and re-emission which have densities that differ by more than 5% from the density of the dielectric fluid are joined to second materials 1202 for setting the density, cf. FIG. 5. The ratio of the volumes of the second material 1202 and of the first material 1201 must be selected such that the overall density of the particle 12 corresponds to the density of the dielectric fluid. In the case of first materials 1201 having a lower density than the dielectric fluid 11, the second materials 1202 must accordingly have a higher density than the dielectric fluid 11. In a corresponding manner, first materials having a higher density than the dielectric fluid must be joined to second materials which accordingly have a lower density than the dielectric fluid. In this way, use may also be made of materials 1201 the density of which differs considerably from the density of the dielectric fluid.

Examples of organic and inorganic materials 1201 which absorb blue light in the region between 350 nm and 500 nm and re-emit with a longer wavelength with an intensity maximum Imax are shown in the following table along with their density. All the materials shown have an efficiency of more than 90% between absorbed and re-emitted light. The Lumogens are in this case dissolved in PMMA carrier material.

| Material | Type | Color | Imax (nm) | Density (g/cm$^3$) |
|---|---|---|---|---|
| CaS:Ce | inorganic | green | 520 | 2.5 |
| $Y_3Al_5O_{12}$:Ce | inorganic | yellow | 570 | 4.56 |
| SrS:Eu | inorganic | red | 610 | 3.7 |
| Lumogen yellow ED206 in PMMA | organic | yellow | 555 | 1.2 |
| Lumogen F orange 240 in PMMA | organic | orange | 545, 575 | 1.2 |
| Lumogen F red 300 in PMMA | organic | red | 615 | 1.2 |

For a dielectric fluid, for example FC-43 from [3]M, having a density of 1.88 g/cm$^3$, a material 1202 having a density <1.88 g/cm$^3$, for example PMMA (Plexiglas) having a density of 1.20 g/cm$^3$, would have to be added to the inorganic materials from Table 1, in order that the resulting particles 12 have a density that is equal to the density of FC-43. By way of example, a particle 12 according to the invention for partially converting blue light into yellow light would accordingly have to consist of 20.2% $Y_3Al_5O_{12}$:Ce and 79.8% PMMA, or two types of particles 121 and 122 for partially converting blue light into green and red light would have to consist of 52.3% CaS:Ce and 47.7% PMMA (particles 121) and 27.2% SrS:Eu and 72.8% PMMA (particles 122). Other inorganic first materials have densities in the range from 2 to 7 g/cm$^3$. The composition of the particles 12 must accordingly be adapted to the density of the first materials.

In a corresponding manner, second materials 1202 having densities >1.88 g/cm$^3$, for example $TiO_2$ having a density of 4.26 g/cm$^3$, must be added to the organic Lumogen materials in the appropriate proportions by volume in order that the resulting particles 12 have a density that is equal to the density of FC-43. The same also applies in respect of all the other suitable organic materials with accordingly different densities.

The use of second materials 1202 with a suitable density which can also be used as materials for absorbing and re-emitting light is particularly advantageous. As a result, the overall particle volume is the same as the light-absorbing volume. By way of example, a density of the particles 12 of 1.88 g/cm$^3$ can be produced when the particles 12 for partially converting blue light into yellow light consist of 20.2% $Y_3Al_5O_{12}$:Ce and 79.8% Lumogen yellow ED206 in PMMA. Unlike in the previous example of embodiment, in this case the entire volume consists of material for partially converting light.

Although it was not possible to give a specific example of an individual material for absorbing and re-emitting light, the density of which corresponds to the density of a suitable dielectric fluid without adding a second material, the present invention nevertheless also extends to embodiments comprising such particles.

The particles consisting of a first 1201 and a second 1202 material can be produced by adding a first material 1201 for absorbing and re-emitting light, in powder form, to a plastic (e.g. PMMA) dissolved by suitable solvents which is provided as the second material 1202, and by homogenizing the solution. The solvents used may be for example anisole, chlorobenzene, methylene chloride or acetic acid. This solution is blown through a nozzle so that the solvent evaporates out of the formed particles in droplet form and the remaining particles 12 are collected. The result obtained is a first material 1201 covered by second material 1202, for example PMMA. The volume ratios between first 1201 and second 1202 material can be set via the concentration of the plastic solution and the quantity of powder material and also by the size of the powder particles. The size of the resulting particles 12 is determined by the nozzle and the blowing process. As an alternative to the solution of plastic materials, the powder of first materials 1201 can also be added to a melt of plastic. The melt is homogenized and blown through a nozzle, wherein once again particles form in droplet form and are collected and possibly cooled. The result obtained is likewise a first material 1201 covered with plastic, for example PMMA.

Organic and inorganic materials differ in terms of their absorption capability. Usually, organic materials have high absorption constants compared to inorganic materials. Inorganic materials are therefore preferred for electroluminescent light sources with a high irradiance and organic materials are preferred for electroluminescent light sources with a low irradiance.

Depending on the structure of the particles 12, for example the surfaces of inorganic crystallites, it is advantageous if the second material for setting the density completely surrounds the first material. In this way, the scattering properties of the particles 12 can be set independently of the absorption properties of the first material 1201 for absorbing light. In addition, the refractive index of the particles can be configured homogeneously by the second material 1202.

The embodiments described with reference to the figures and the description are merely examples of a lighting device and are not intended to be understood as limiting the patent claims to these examples. Alternative embodiments which are likewise covered by the scope of protection of the patent claims are also possible for the person skilled in the art. The numbering of the dependent claims is not intended to imply that other combinations of the claims do not also represent advantageous embodiments of the invention.

The invention claimed is:

1. An electroluminescent light source comprising:
    a substrate,
    a layer structure applied to the substrate for emitting light at least on the side facing away from the substrate, said layer structure comprising at least one electrode as anode, at least one electrode as cathode and at least one organic electroluminescent layer located therebetween, wherein one of the anode and cathode is at least partially transparent and is on a side facing away from the substrate, and
    an at least partially transparent encapsulation device having a peripheral edge which is glued to the layer structure for forming a closed volume around the layer structure, wherein the closed volume defines an empty space surrounded by the peripheral edge, the closed volume being filled with a liquid including a dielectric fluid which is substantially chemically inert with respect to the layer structure, said fluid containing particles for absorbing parts of the light emitted by the layer structure and for re-emitting light of a different wavelength, a density of said particles being selected such that the particles in the dielectric fluid are in the suspended state in an operational state during use of the electroluminescent light source for providing the light.

2. The electroluminescent light source as claimed in claim 1, wherein a proportion by volume of the particles in the dielectric fluid is between 5 and 60%.

3. The electroluminescent light source as claimed in claim 1, wherein the particles have a diameter greater than 100 nm.

4. The electroluminescent light source as claimed in claim 1, wherein a refractive index of the particles is greater than 1.4.

5. The electroluminescent light source as claimed in claim 1, wherein the particles consist of a first material for absorbing and re-emitting light and a second material for setting their density.

6. The electroluminescent light source as claimed in claim 5, wherein the first material for absorbing and re-emitting light is a material which has a high density and the second material for setting the density is a material for absorbing and re-emitting light which has a low density.

7. The electroluminescent light source as claimed in claim 5, wherein the first material of the particles comprises an inorganic material or organic material.

8. The electroluminescent light source as claimed in claim 5, wherein the first material of the particles is surrounded by the second material of the particles.

9. The electroluminescent light source as claimed in claim 1, wherein the dielectric fluid contains at least first particles for emitting light in a first spectral region and second particles for emitting light in a second spectral region.

10. A method of producing a dielectric fluid which contains particles for absorbing light and for re-emitting light of a different wavelength, wherein a density of the particles is selected such that the particles in the dielectric fluid are in the suspended state, for use in organic electroluminescent light sources as claimed in claim 5, said method comprising the acts of:
    producing a solution or melt of the second material of the particles,
    adding pulverulent first material for absorbing and re-emitting light to the solution or melt of the second material of the particles, in a concentration suitable for producing a specific density of the particles,
    blowing the solution or melt through a nozzle to form particles of joined first and second material,
    collecting and cooling the particles,
    adding the particles thus formed to the dielectric fluid,
    removing the particles with densities that are too low/high following rising and/or sedimentation thereof in the dielectric fluid,
    producing a homogeneous distribution of the particles in the dielectric fluid by rotating or stirring in a suitable container.

11. A method of producing an electroluminescent light source comprising the acts of:
    forming a layer structure for emitting light over a substrate, the layer structure comprising at least one organic electroluminescent layer located between two electrodes;
    forming an at least partially transparent encapsulation device having a peripheral edge;
    gluing the peripheral edge to the layer structure to form a closed volume around the layer structure, the closed volume defining an empty space surrounded by the peripheral edge; and
    filling the closed volume of the encapsulation device with a dielectric fluid which is substantially chemically inert with respect to the layer structure, said dielectric fluid containing particles for absorbing parts of the light emitted by the layer structure and for re-emitting light of a different wavelength, a density of said particles being selected such that the particles in the dielectric fluid are in a suspended state in an operational state during use of the electroluminescent light source for providing the light.

12. The method of claim 11, wherein a proportion by volume of the particles in the dielectric fluid is between 5 and 60%.

13. The method of claim 11, wherein the particles have a diameter greater than 100 nm.

14. The method of claim 11, wherein a refractive index of the particles is greater than 1.4.

15. The method of claim 11, wherein the particles consist of a first material for absorbing and re-emitting light and a second material for setting their density.

16. The method of claim 15, wherein the first material for absorbing and re-emitting light is a material which has a high density and the second material for setting the density is a material for absorbing and re-emitting light which has a low density.

17. The method of claim 15, wherein the first material of the particles is surrounded by the second material of the particles.

18. The method of claim 11, wherein the dielectric fluid contains at least first particles for emitting light in a first spectral region and second particles for emitting light in a second spectral region.

19. The method of claim 11, wherein the filling act is performed after the gluing act, and the filling act fills the closed volume with the dielectric fluid through a closable opening, the method further comprising the act of closing the opening after the filling act.

20. The method of claim 11, wherein the gluing act is performed after the filling act.

* * * * *